(12) United States Patent
Yamada (10) Patent No.: US 12,198,613 B2
(45) Date of Patent: Jan. 14, 2025

(54) DISPLAY DEVICE

(71) Applicant: SHARP KABUSHIKI KAISHA, Sakai (JP)

(72) Inventor: Junichi Yamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/273,533

(22) PCT Filed: Feb. 2, 2021

(86) PCT No.: PCT/JP2021/003692
§ 371 (c)(1),
(2) Date: Jul. 20, 2023

(87) PCT Pub. No.: WO2022/168146
PCT Pub. Date: Aug. 11, 2022

(65) Prior Publication Data
US 2024/0096269 A1 Mar. 21, 2024

(51) Int. Cl.
*G09G 3/32* (2016.01)
(52) U.S. Cl.
CPC ....... *G09G 3/32* (2013.01); *G09G 2310/0267* (2013.01); *G09G 2310/08* (2013.01)

(58) Field of Classification Search
CPC .............................. G09G 3/32; H10K 59/131
See application file for complete search history.

(56) References Cited

U.S. PATENT DOCUMENTS

| 10,636,356 | B1 | 4/2020 | Qian et al. |
| 2019/0305065 | A1 | 10/2019 | Kim et al. |
| 2020/0185484 | A1 | 6/2020 | Cho et al. |
| 2020/0202771 | A1 | 6/2020 | Takasugi |
| 2020/0373377 | A1 | 11/2020 | Kim et al. |
| 2021/0249498 | A1* | 8/2021 | Cho .................. H10K 50/80 |

FOREIGN PATENT DOCUMENTS

| CN | 111508995 A | 8/2020 |
| JP | 2020-101604 A | 7/2020 |

* cited by examiner

*Primary Examiner* — Sardis F Azongha
(74) *Attorney, Agent, or Firm* — ScienBiziP, P.C.

(57) ABSTRACT

A display device includes: a display region; a first driver driving a plurality of control lines; a second driver provided between the display region and the first driver, and driving a plurality of scan signal lines; an output wire extending from the first driver, intersecting with the second driver; and reaching a clearance region between the second driver and the display region; and a plurality of branch wires connected to the output wire (SHc) in the clearance region.

14 Claims, 10 Drawing Sheets

DISPLAY DEVICE

TECHNICAL FIELD

The disclosure relates to a display device.

BACKGROUND ART

Patent Document 1 discloses a configuration in which a light-emission control circuit and a scan signal line drive circuit are provided outside a display region including a plurality of subpixels.

CITATION LIST

Patent Document

[Patent Document 1] Japanese Unexamined Patent Application Publication No. 2020-101604

SUMMARY

Technical Problem

A display device provided with a plurality of drivers outside a display region is required to have a configuration that allows the drivers to be laid out more flexibly.

Solution to Problem

A display device according to an aspect of the disclosure includes: a display region including a plurality of pixel circuits each including a light-emitting element; a plurality of signal lines and a plurality of control lines connected to the plurality of pixel circuits; a first driver driving the plurality of control lines; a second driver disposed between the display region and the first driver, and driving the plurality of signal lines; an output wire extending from the first driver, intersecting with the second driver, and reaching a clearance region between the second driver and the display region; and a plurality of branch wires connected to the output wire in the clearance region.

Advantageous Effects of Disclosure

An aspect of the disclosure is directed to a display device provided with a plurality of drivers outside a display region. The aspect allows the drivers to be laid out more flexibly.

DESCRIPTION OF EMBODIMENTS

Figure 1:
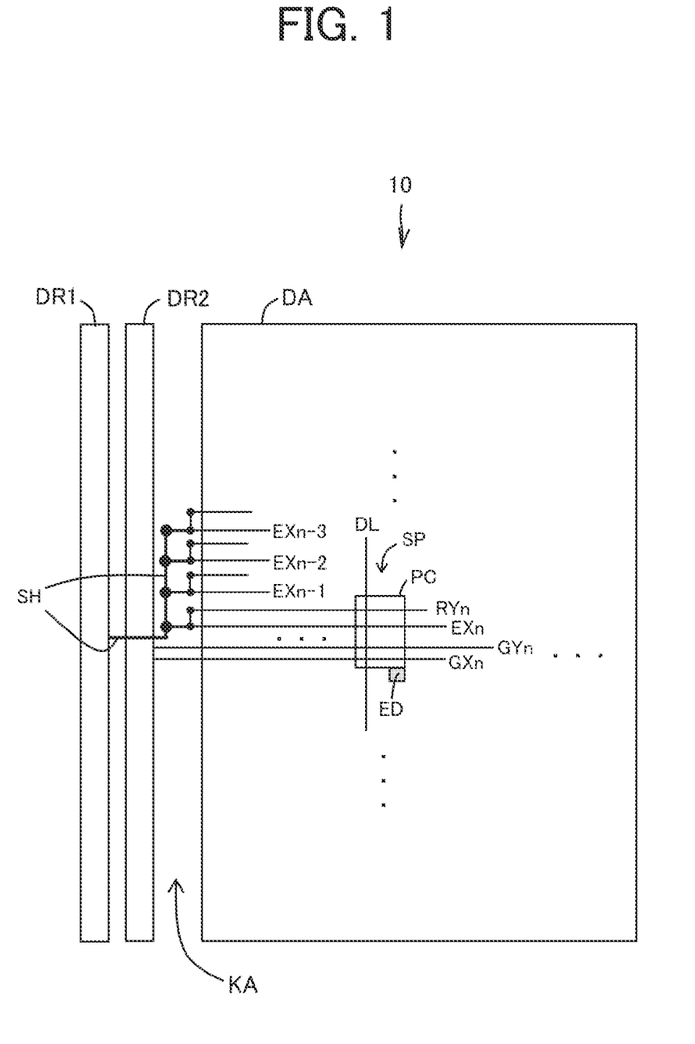
FIG. 1 is a schematic plan view of a configuration of a display device according to this embodiment.
Figure 2:
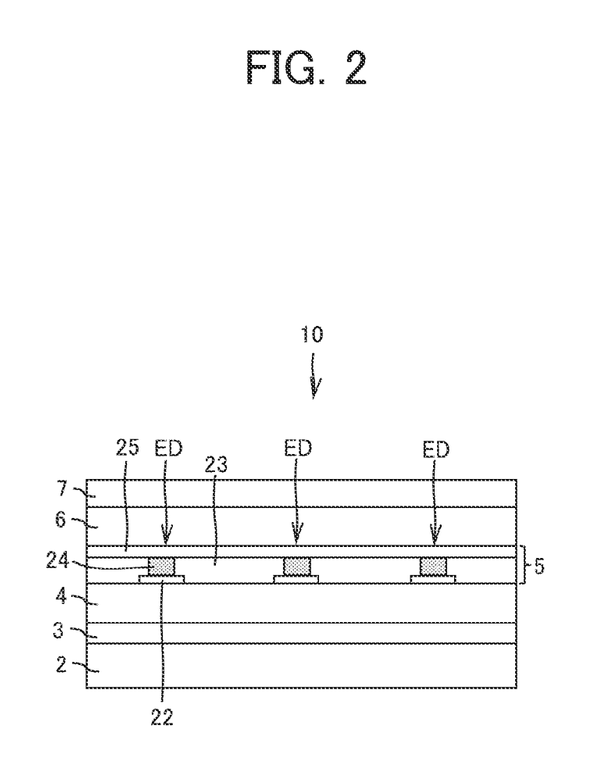
FIG. 2 is a schematic cross-sectional view of a configuration of the display device according to this embodiment.

FIG. 1 is a schematic plan view of a configuration of a display device according to this embodiment. FIG. 2 is a schematic cross-sectional view of a configuration of the display device according to this embodiment. As illustrated in FIG. 1, a display device 10 includes a display region DA provided with a plurality of subpixels SP. Each of the subpixels SP includes: a light-emitting element ED; and a pixel circuit PC controlling the light-emitting element ED. The pixel circuit PC is connected to such lines as a data signal line DL, scan signal lines GXn and GYn, a light-emission control line EXn, and a reset line RYn. (Details will be described later). The display device 10 includes: a first driver DR1 provided outside the display region DA, and driving a plurality of control lines (e.g., a light-emission control line); and a second driver DR2 disposed between the first driver DR1 and the display region DA, and driving a plurality of signal lines (e.g., a scan signal line).

As illustrated in FIG. 2, the display device 10 includes: a barrier layer 3; a thin-film transistor layer (a TFT layer) 4 including a pixel circuit PC; a light-emitting element layer 5 including a light-emitting element ED; a sealing layer 6; and a functional layer 7, all of which are provided in the stated order above a substrate 2.

The substrate 2 is either a glass substrate or a flexible substrate mainly made of a resin such as polyimide. For example, the substrate 2 can be formed of: two polyimide films; and an inorganic film sandwiched between the two polyimide films. The barrier layer 3 can be an inorganic insulating layer that prevents entry of foreign substances such as water and oxygen. The TFT layer 4 includes the pixel circuit PC formed to control the light-emitting element ED. (Details will be described later).

The light-emitting element layer 5 includes: a lower electrode 22; an edge cover film 23 providing insulation and covering an edge of the lower electrode 22; an electroluminescence (EL) layer 24 above the edge cover film 23; and an upper electrode 25 above the EL layer 24. In forming the edge cover film 23, for example, an organic material such as polyimide or acrylic resin is applied. After that, the applied organic material is patterned by photolithography to form the edge cover film 23.

The light-emitting element layer 5 includes a plurality of the light-emitting elements ED formed to emit light in different colors. Each of the light-emitting elements ED includes: the lower electrode 22 shaped into an island; the EL layer 24 including a light-emitting layer; and the upper electrode 25. The upper electrode 25 is a monolithic common electrode common to the plurality of light-emitting elements ED.

The light-emitting element ED may be, for example, an organic light-emitting diode (OLED) including an organic layer as a light-emitting layer, or a quantum-dot light-emitting diode (QLED) including a quantum-dot layer as a light-emitting layer.

The EL layer 24 is a multilayer including: a hole injection layer; a hole transport layer; a light-emitting layer; an electron transport layer; and an electron injection layer, all of which are stacked on top of another in the stated order from below. The light-emitting layer is formed into an island shape in an opening (for each subpixel) of the edge cover film 23. The light-emitting layer is formed by evaporation, inkjet printing, or photolithography. The other layers are formed into island shapes or into monolithic shapes (common layers). Moreover, one or more of the hole injection layer, the hole transport layer, the electron transport layer, and the electron injection layer may be omitted.

The lower electrode 22 (an anode) is formed of a multilayer including, for example, indium tin oxide (ITO) and either silver (Ag) or an alloy containing Ag. The lower electrode is reflective to light. The upper electrode 25 (a cathode) is a thin metal film formed of such a metal as a magnesium-silver alloy. The upper electrode 25 is transparent to light.

If the light-emitting element ED is an OLED, holes and electrons recombine together in the light-emitting layer by a drive current between the lower electrode 22 and the upper electrode 25, which forms an exciton. While the exciton transforms to the ground state, light is released. If the light-emitting element ED is a QLED, holes and electrons recombine together in the light-emitting layer by a current between the lower electrode 22 and the upper electrode 25, which forms an exciton. While the exciton transforms from the conduction band level to the valence band level of the quantum dots, light is released.

The sealing layer 6 covering the light-emitting element layer 5 is a layer for preventing foreign substances such as water and oxygen from penetrating into the light-emitting element layer 5. The sealing layer 6 may include, for example, two inorganic sealing films and an organic film formed between the two inorganic sealing films. The functional layer 7 has such various functions as an optical control function, a touch sensor function, and a surface protection function.

Figure 3:
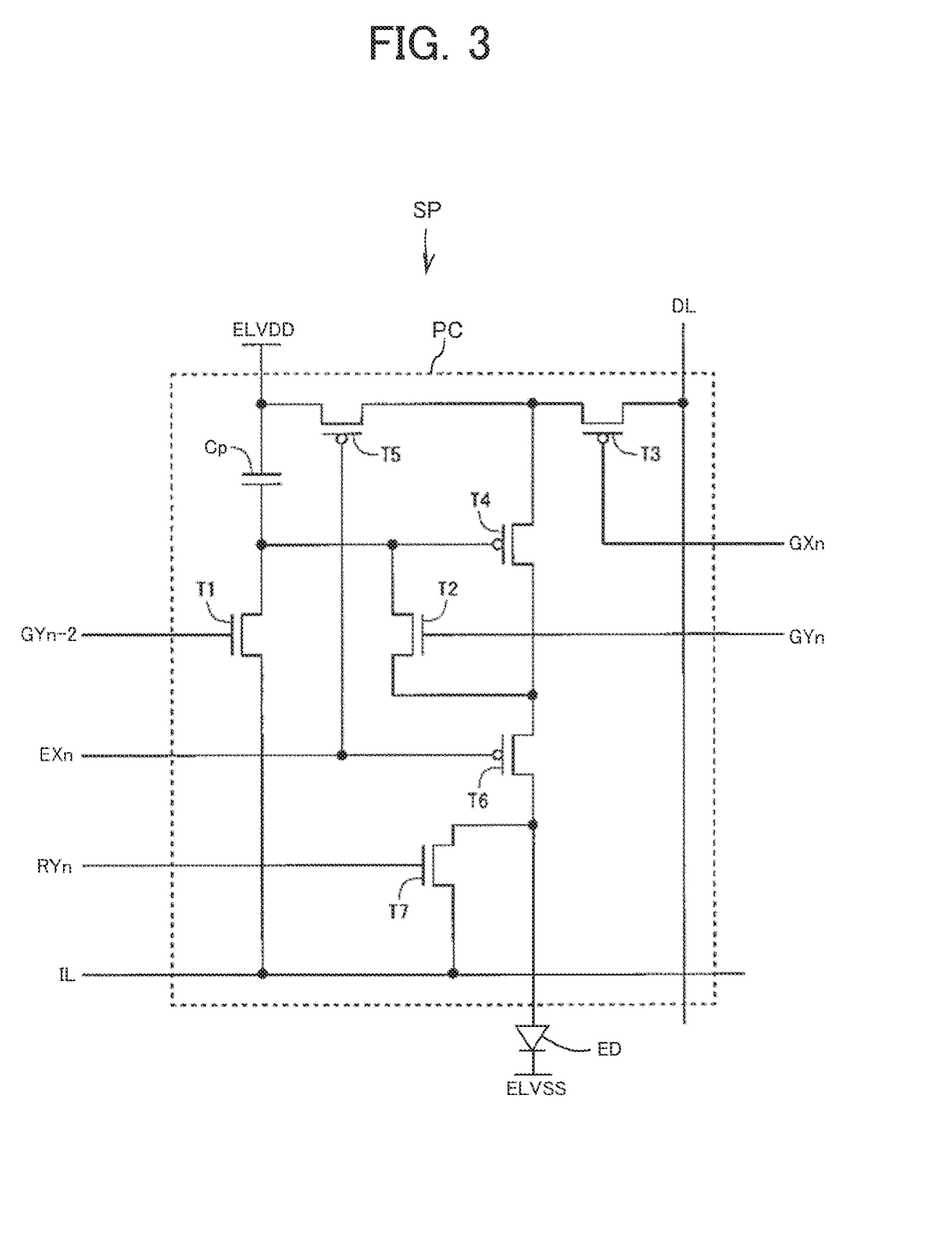
FIG. 3 is a circuit diagram illustrating a subpixel according to this embodiment.

FIG. 3 is a circuit diagram illustrating a subpixel according to this embodiment. The pixel circuit PC includes: a pixel capacitor Cp; a transistor T1 having a gate electrode connected to a scan signal line GYn−2 in the second preceding stage (the n−2-th stage); a transistor T2 having a gate electrode connected to a scan signal line GYn in the stage (the n-th stage) of the transistor T2; a transistor T3 having a gate electrode connected to a scan signal line GXn in the the stage (the n-th stage) of the transistor T3; a transistor T4 (a drive transistor) that controls a current value of the light-emitting element ED; a transistor T5 having a gate electrode connected to a light-emission control line EXn in the stage (the n-th stage) of the transistor T5; a transistor T6 (a light-emission control transistor) having a gate electrode connected to the light-emission control line EXn; and a transistor T7 (a reset transistor) having a gate electrode connected to a reset line RYn. The transistors T1, T2, and T7 are, for example, N-channel oxide semiconductor transistors, and the transistors T3 to T6 are, for example, P-channel polysilicon transistors.

The transistor T4 has a gate electrode GE connected to a power source line PL through the pixel capacitor Cp, and to an initialization signal line TL through the transistor T1. The power source line PL is supplied with a high-voltage power source (ELVDD). The initialization signal line IL, and the cathode (the upper electrode 25) of the light-emitting element ED, are supplied with, for example, a low-voltage power source (ELVSS).

The transistor T4 has a source electrode connected to a data signal line DL through the transistor T3, and to the power source line PL through the transistor T5. The transistor T4 has a drain electrode connected to the anode (the lower electrode 22) of the light-emitting element ED through the transistor T6, and to the gate electrode GE of the transistor T4 through the transistor T2. The anode (the lower electrode 22) of the light-emitting element ED is connected to the initialization signal line TL through the transistor T7.

Figure 4:
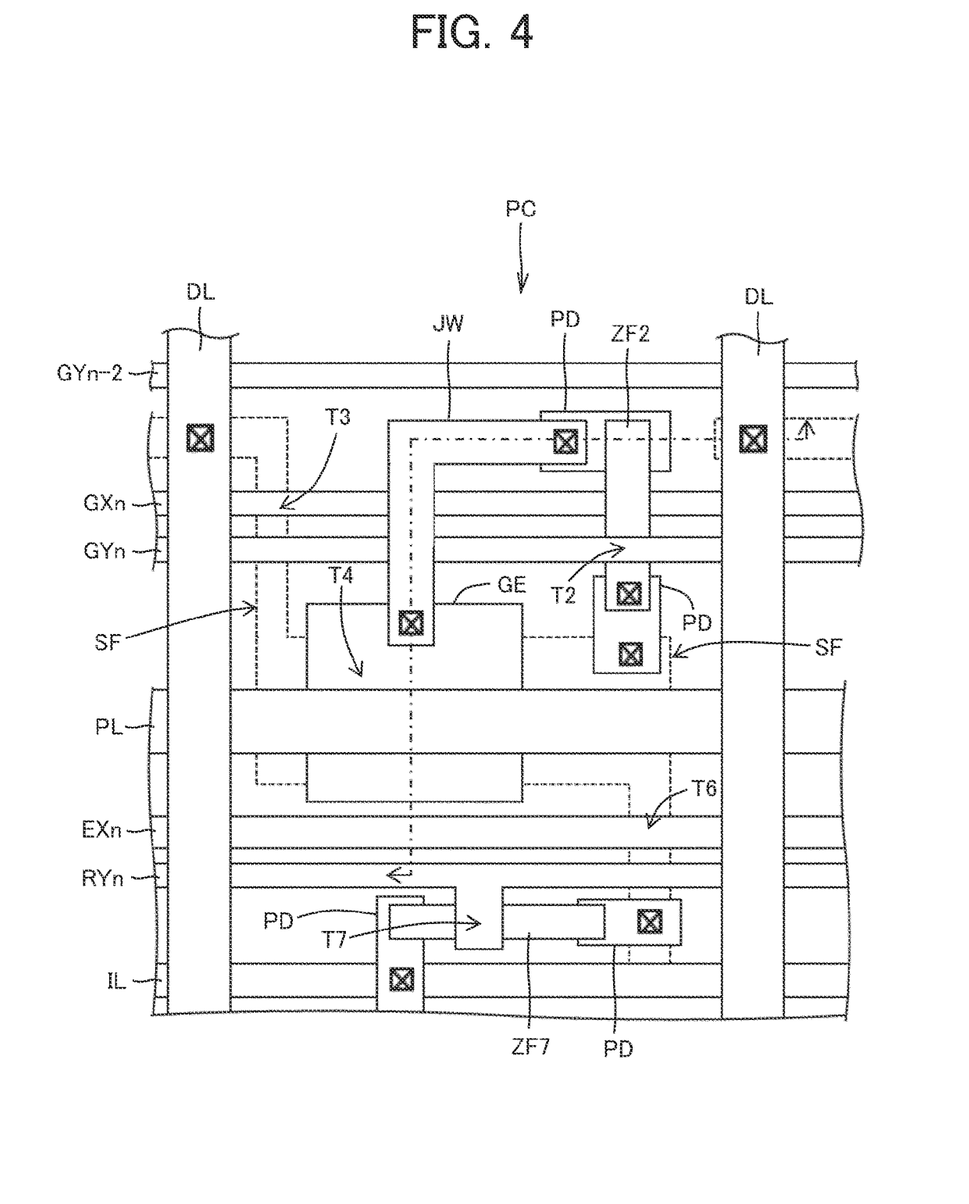
FIG. 4 is a plan view of a configuration of a TFT layer according to this embodiment.
Figure 5:
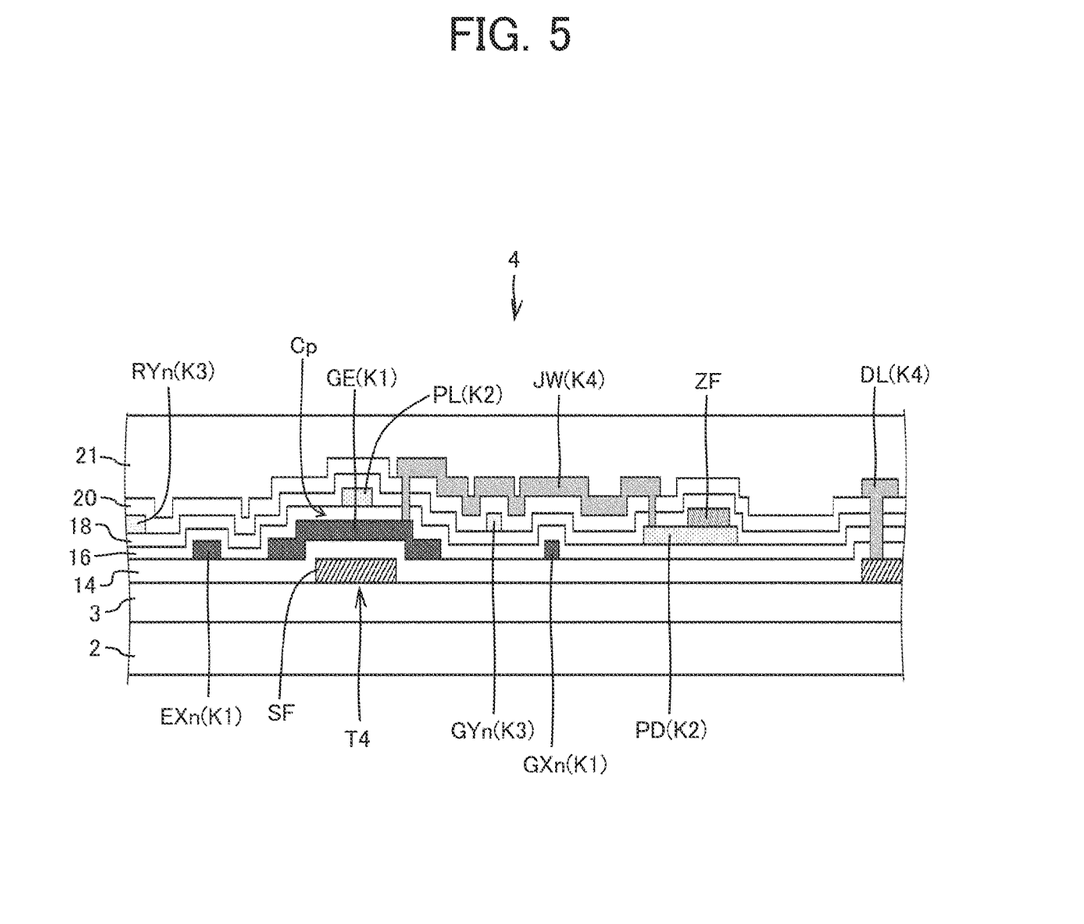
FIG. 5 is a cross-sectional view taken along an arrow in FIG. 4.

FIG. 4 is a plan view of a configuration of a TFT layer according to this embodiment. FIG. 5 is a cross-sectional view taken along an arrow in FIG. 4. As illustrated in FIGS. 4 and 5, the TFT layer 4 includes: a silicon film SF formed on the barrier layer 3; an inorganic insulating film 14 (a first gate insulating film) covering the silicon film SF; a first metal layer K1 formed above the inorganic insulating film 14, and including the scan signal line GXn and the gate electrode GE of the transistor T4: an inorganic insulating film 16 covering the first metal layer K1; a second metal layer K2 formed above the inorganic insulating film 16, and including the power source line PL and a pad film PD; an oxide semiconductor film ZF formed above the second metal layer K2; an inorganic insulating film 18 (a second gate insulating film) covering the oxide semiconductor film ZF; an inorganic insulating film 18 (a second gate insulating film) covering the oxide semiconductor film ZF; a third metal layer K3 formed above the inorganic insulating film 18, and including the scan signal lines GYn and GYn−2; an inorganic insulating film 20 covering the third metal layer K3; a fourth metal layer K4 formed above the inorganic insulating film 20, and including the data signal line DL and a source wire JW; and a planarization film 21 covering the fourth metal layer K4.

The silicon film SF is made of, for example, low-temperature polysilicon (LTPS). The silicon film SF includes: a channel portion (a portion overlapping with the first metal layer K1) that functions as a semiconductor; and a conductor portion (a portion not overlapping with the first metal layer K1) that functions as a conductor when doped with, for example, an impurity.

The oxide semiconductor film ZF is formed of a compound (e.g., InGaZnO) containing oxygen and at least one selected from, for example, indium (In), gallium (Ga), tin (Sn), hafnium (Hf), zirconium (Zr), and zinc (Zn). The oxide semiconductor film ZF includes: a channel portion (a portion overlapping with the third metal layer K3) that functions as a semiconductor, and a conductor portion (a portion not overlapping with the third metal layer K3) that functions as a conductor by reduction.

Each of the first metal layer K1, the second metal layer K2, the third metal layer K3, and the fourth metal layer K4 is a metal monolayer film or a metal multilayer film containing at least one of, for example, aluminum, tungsten, molybdenum, tantalum, chromium, titanium, or copper.

Each of the inorganic insulating films 14, 16, 18 and 20 may be a monolayer film formed of silicon oxide ($SiO_x$) or silicon nitride ($SiN_x$). Alternatively, each of the films may be a multilayer film formed of these materials. The planarization film 21 may be formed of an applicable organic material such as polyimide or acrylic resin.

The transistor T4 includes the channel portion (a portion overlapping with the gate electrode GE) of the silicon film SF, and a pixel capacitor Cp is formed between the gate electrode GE and the power source line PL. The gate electrode GE is connected to the source wire JW through a contact hole, and the source wire JW is connected to the pad film PD of the second metal layer K2 through a contact hole. Moreover, the oxide semiconductor film ZF (the conductor portion) is provided in contact with the pad film PD.

Figure 6:
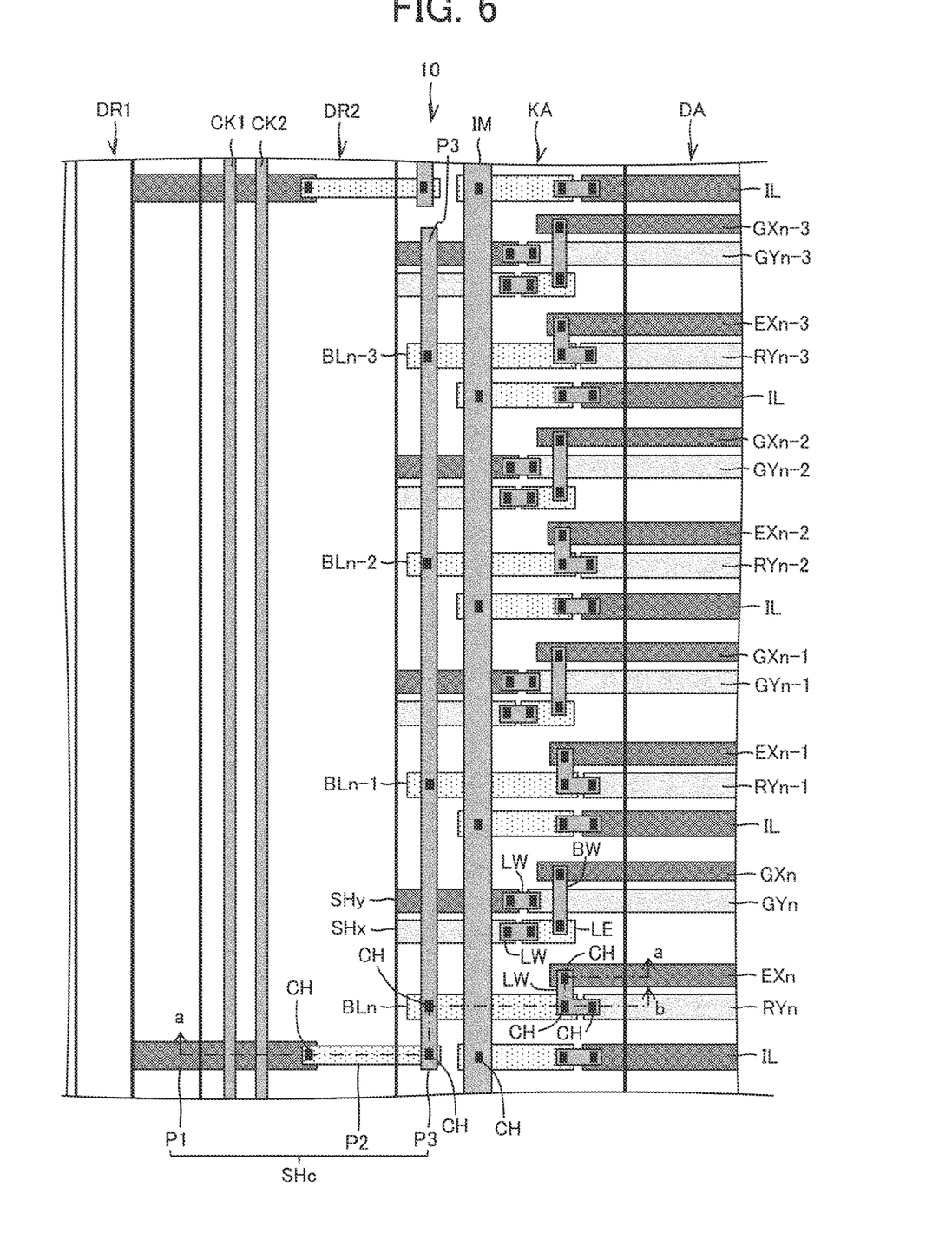
FIG. 6 is a plan view of a configuration around a display region according to this embodiment.
Figure 7:
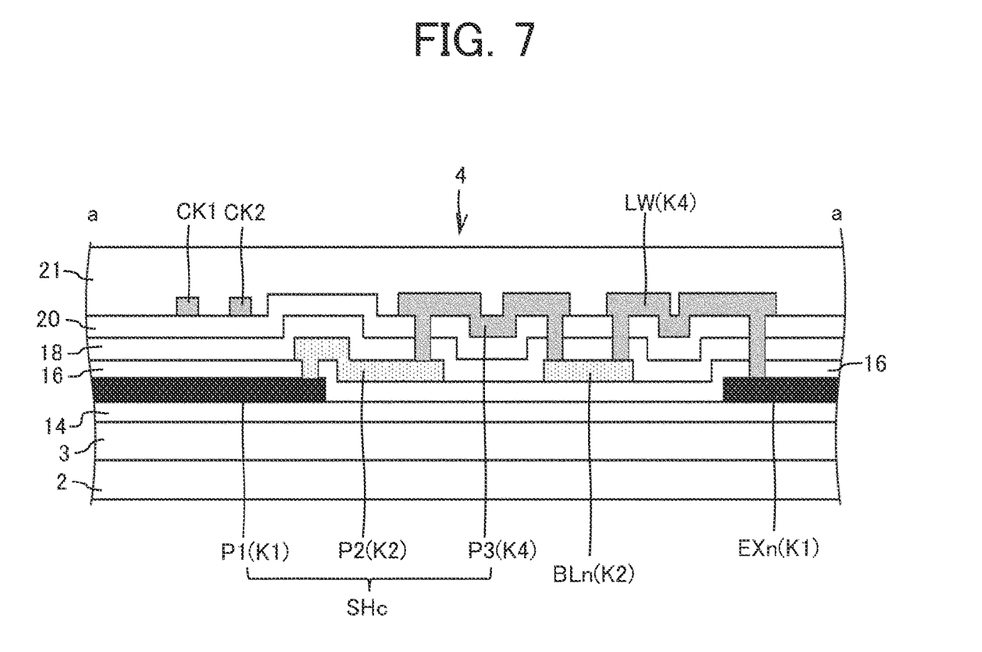
FIG. 7 is a cross-sectional view taken along line a-a in FIG. 6.
Figure 8:
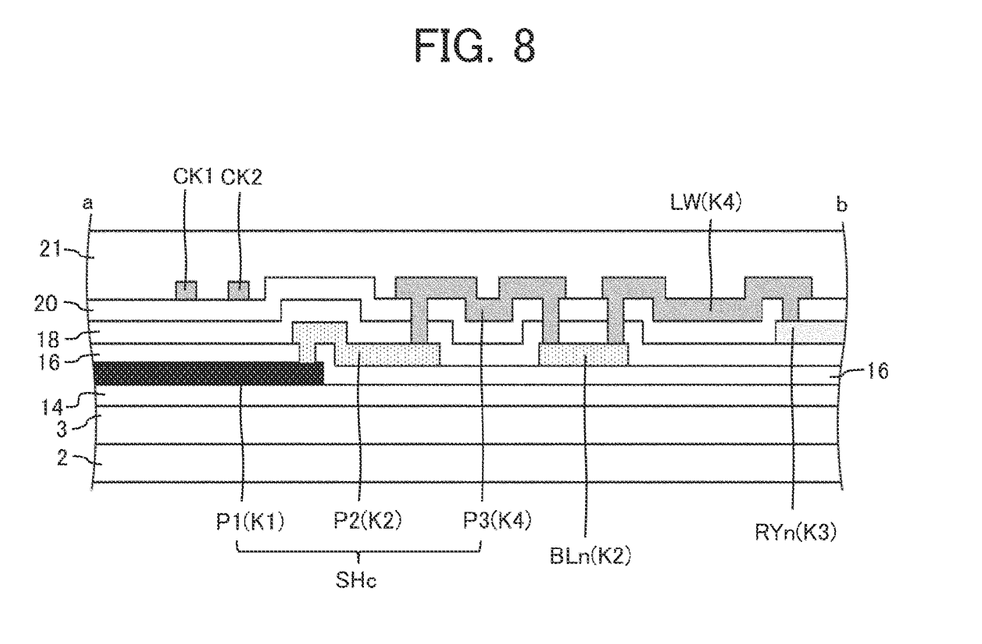
FIG. 8 is a cross-sectional view taken along line a-b in FIG. 6.

FIG. 6 is a plan view of a configuration around the display region according to this embodiment. FIG. 7 is a cross-sectional view taken along line a-a in FIG. 6. FIG. 8 is a cross-sectional view taken along line a-b in FIG. 6. The display device 10 includes: the display region DA; light-emission control lines EXn−3 to EXn included in the plurality of control lines; the first driver DR1 driving reset lines RYn−3 to RYn included in the plurality of control lines; and the second driver DR2 disposed between the display region DA and the first driver DR1, and driving a plurality of scan signal lines EXn−3 to EXn and EYn−3 to EYn. The display device 10 includes: an output wire SHc extending from the first driver DR1, intersecting with the second driver DR2, and reaching a clearance region KA between the second driver DR2 and the display region DA; and a plurality of branch wires BLn−3, BLn−2, BLn−1, and BLn connected to the output wire SHc in the clearance region KA.

The second driver DR2 includes clock wires CK1 and CK2 through which clock signals are transmitted. The output wire SHc intersects with the clock wires CK1 and CK2. Specifically, the output wire SHc includes: a first portion P1 intersecting with the clock wires CK1 and CK2; a second portion P2 connected to the first portion P1 through a contact hole CH; and a third portion P3 connected to the second portion P2 through a contact hole CH, and positioned in the clearance region KA.

The first portion P1 is included in the first metal layer K1, and the clock wires CK1 and CK2 are included in the fourth metal layer K4. Moreover, the second portion P2 is included in the second metal layer K2, the third portion P3 is included in the fourth metal layer K4, and the plurality of branch wires BLn−3 to BLn are included in the second metal layer K2.

The clearance region KA between the second driver DR2 and the display region DA includes a signal main line IM intersecting with the plurality of branch wires BLn−3 to BLn. The signal main line IM is included in the fourth metal layer K4, and connected to the initialization signal line TL (the first metal layer) through a contact hole. Note that the initialization signal line TL may be formed in the second metal layer K2.

The light-emission control lines EXn−3 to EXn are included in the first metal layer K1. The reset lines RYn−3 to RYn are included in the third metal layer K3. Each of the branch wires (e.g., BLn) is connected through a relay wire LW included in the fourth metal layer K4 to corresponding control lines (e.g., the light-emission control line EXn and the reset line RYn) among the light-emission control lines EXn−3 to EXn and the reset lines RYn−3 to RYn.

Specifically, the branch wire BLn−3 is electrically connected to the light-emission control line EXn−3 and the reset line RYn−3. The branch wire BLn−2 is electrically connected to the light-emission control line EXn−2 and the reset line RYn−2. The branch wire BLn−1 is electrically connected to the light-emission control line EXn−1 and the reset line RYn−1. The branch wire BLn is electrically connected to the light-emission control line EXn and the reset line RYn. That is, one output wire SHc from the first driver DR1 is electrically connected to the light-emission control lines and the reset lines for four stages (eight lines in total).

The scan signal line GYn included in the third metal layer K3 is connected to an output line SHy (the first metal layer) of the second driver DR2 through a relay wire LW. The scan signal line GXn included in the first metal layer K1 is connected: to a bridge wire BW included in the fourth metal layer K4 and crossing the scan signal line GYn; to a relay electrode LE included in the second metal layer K2; and to an output line SHx (the third metal layer) of the second driver DR2 through the relay wire LW. The relay wire LW, the bridge wire BW, and the relay electrode LE are included in the clearance region KA (outside the display region DA).

Figure 9:
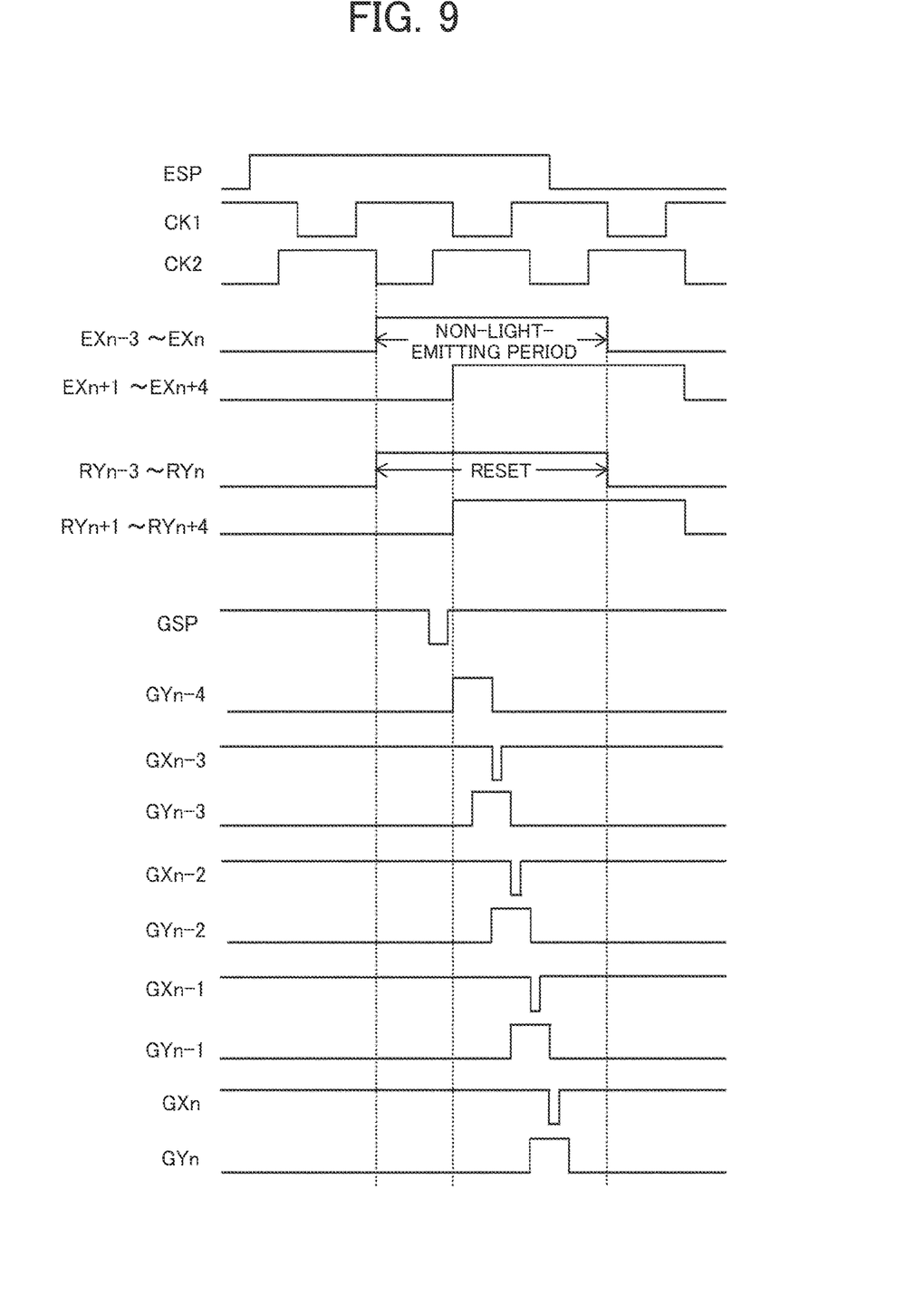
FIG. 9 is a timing diagram illustrating an operation of the display device according to this embodiment.

FIG. 9 is a timing diagram illustrating an operation of the display device according to this embodiment. As illustrated in FIG. 9, during a non light-emission period in which four light-emission control lines EXn−3 to EXn corresponding to four stages go High (the transistor T6 in FIG. 3 turns OFF), four scan signal lines GXn−3 to GXn corresponding to four stages sequentially go active Low (the transistor T3 turns ON). Simultaneously, four scan signal lines GYn−3 to GYn corresponding to four stages sequentially go active High (the transistor T2 turns ON). Hence, data signals are written from data signal line DL to pixel circuits PC for four stages. In synchronization with this non light-emission period, the reset lines RYn−3 to RYn go High (the transistor T7 in FIG. 3 turns ON), which initializes anode potentials (potentials of lower electrodes 22 in the light-emitting elements ED) of the pixel circuits PC four stages.

Figure 11:
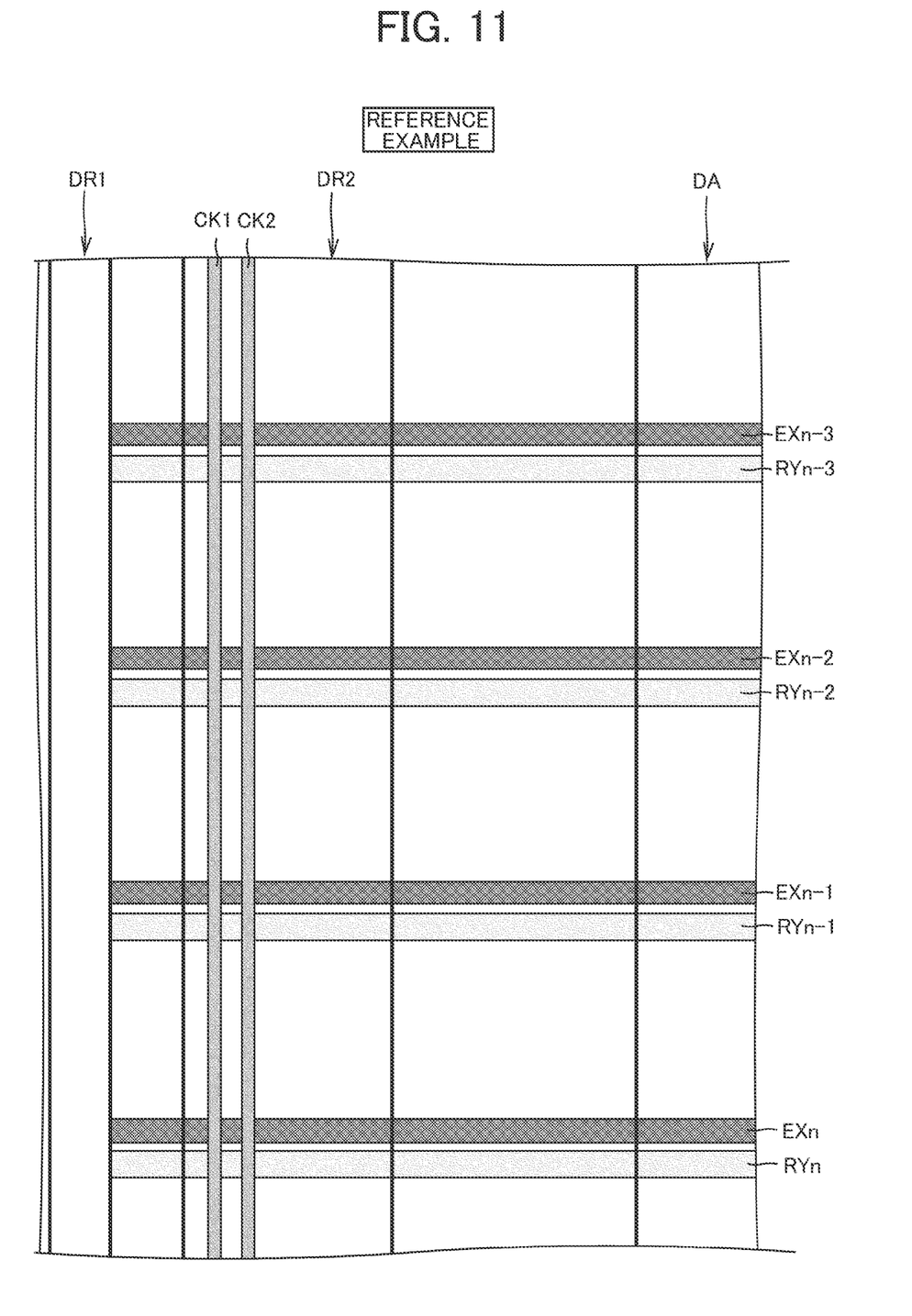
FIG. 11 is a plan view of a reference example around the display region.

In this embodiment, one output wire SHc is lead from the first driver DR1, laid across the second driver DR2, and electrically connected to light-emission control lines and reset lines for four stages (eight lines in total). Compared with a reference example in which light-emission control lines and reset lines for four stages (eight lines in total) are laid across the second driver DR2 as illustrated in FIG. 11, a layout of the second driver DR2 can be determined more flexibly. Moreover, the number of outputs of the first driver DR1 can be reduced to one-eighth the number of outputs of the reference example. Hence, a layout of the first driver DR1 can be determined more flexibly.

Furthermore, the output wire SHc intersects with the clock wires CK1 and CK2. Compared with the reference example in which light-emission control lines and reset lines for four stages (eight lines in total) intersect with the clock wires CK1 and CK2 as illustrated in FIG. 11, parasitic capacitance of the clock wires CK1 and CK2 is decreased and an edge of a clock signal is less likely to be rounded. In addition, the output wire SHc has a portion (the first portion P1) formed in the first metal layer K1 and intersecting with the clock wires CK1 and CK2 (the fourth metal layer K4), and the inorganic insulating films 16, 18, and 20 are found between the first portion and the clock wires CK1 and CK2. Hence, the parasitic capacitance of the clock wires CK1 and CK2 is further reduced.

In this embodiment, the light-emission control lines EXn−3 to EXn and the reset lines RYn−3 to RYn are connected to the output wire SHc with relay electrodes LW included in the fourth metal layer K4. That is, in the process of producing the TFT layer 4, the light-emission control lines EXn−3 to EXn and the reset lines RYn−3 to RYn are not electrically connected to the first driver DR1 until the fourth metal layer K4 is formed. Such a feature is effective as an electrostatic discharge (ESD) countermeasure. The same applies to the scan signal lines GXn−3 to GXn and GYn−3 to GYn and the second driver DR2.

Figure 10:
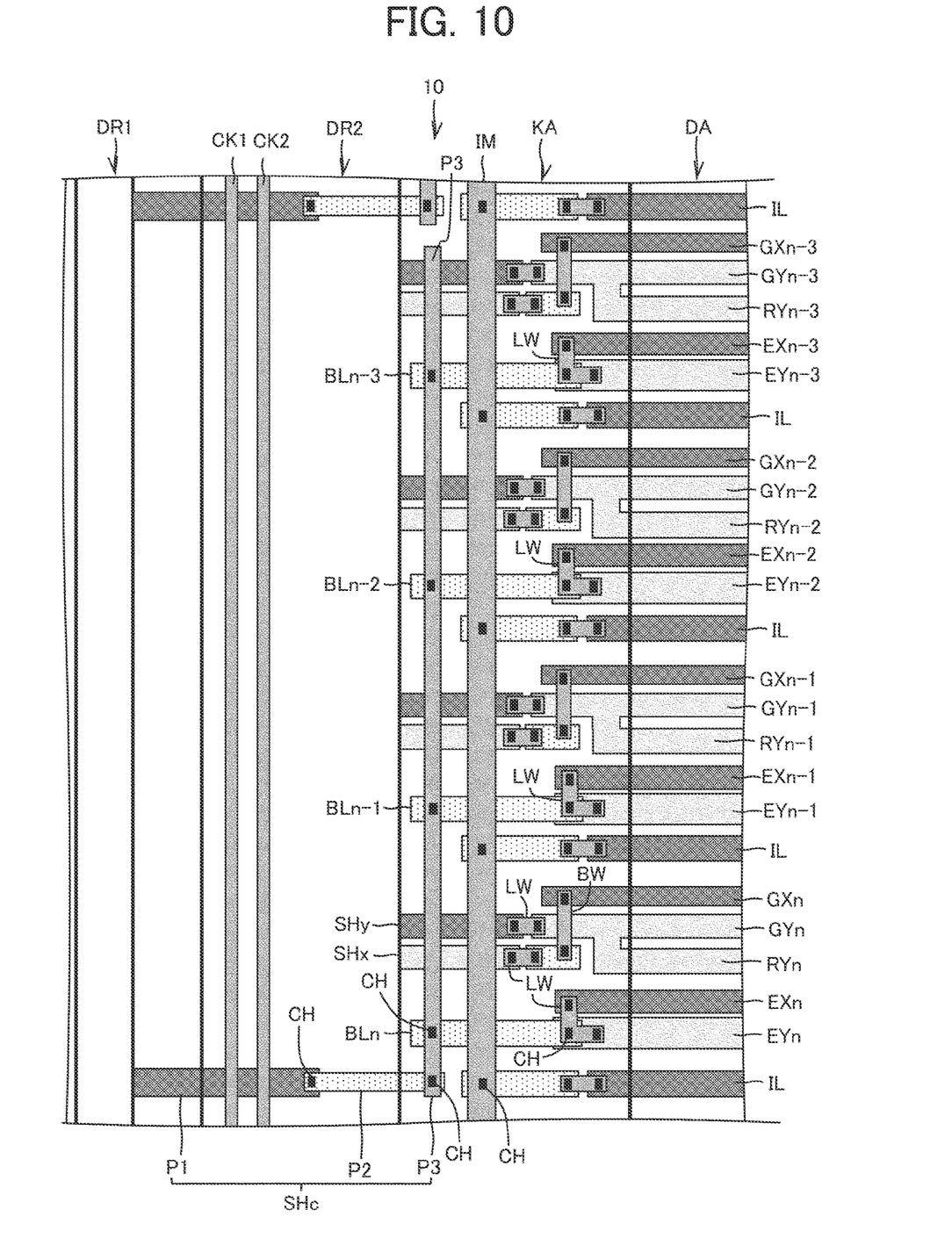
FIG. 10 is a plan view of another configuration around the display region according to this embodiment.

FIG. 10 is a plan view of another configuration around the display region according to this embodiment. In FIG. 6, the reset lines RYn−3 to RYn are connected to, but not limited to, the first driver DR1. As illustrated in FIG. 10, the reset lines RYn−3 to RYn may be connected to the second driver DR2. Specifically, in the clearance region KA, the reset line RYn may branch from the scan signal line GYn, the reset line RYn−1 may branch from the scan signal line GYn−1, the reset line RYn−2 may branch from the scan signal line GYn−2, and the reset line RYn−3 may branch from the scan signal line GYn−3.

In FIG. 10, the output line SHc extending from the first driver DR1 has the third portion P3 connected to the branch wires BLn–3 to BLn in the clearance region KA. The branch wire BLn–3 is connected to the light-emission control line EXn–3 (the first metal layer K1) and the light-emission control line EYn–3 (the third metal layer K3) through a relay wire LW. The branch wire BLn–2 is connected to the light-emission control line EXn–2 (the first metal layer K1) and the light-emission control line EYn–2 (the third metal layer K3) through a relay wire LW. The branch wire BLn–1 is connected to the light-emission control line EXn–1 (the first metal layer K1) and the light-emission control line EYn–1 (the metal layer K3) through a relay wire LW. The branch wire BLn is connected to the light-emission control line EXn (the first metal layer K1) and the light emission control line EYn (the third metal layer K3) through a relay wire LW. In the display region DA, the light-emission control lines are routed between two layers.

Each of the above-described embodiments is presented not for limitative purposes but for illustrative and descriptive purposes. It will be apparent to those skilled in the art that many variations are applicable in accordance with these illustrations and descriptions.

SUMMARY

[First Aspect] A display device, including:
a display region including a plurality of pixel circuits each including a light-emitting element;
a plurality of signal lines and a plurality of control lines connected to the plurality of pixel circuits;
a first driver configured to drive the plurality of control lines;
a second driver disposed between the display region and the first driver, and configured to drive the plurality of signal lines;
an output wire extending from the first driver, intersecting with the second driver, and reaching a clearance region between the second driver and the display region; and
a plurality of branch wires connected to the output wire in the clearance region.

[Second Aspect] The display device according to, for example, the first aspect,
wherein the second driver includes a clock wire through which a clock signal is transmitted, and
the output wire intersects with the clock wire.

[Third Aspect] The display device according to, for example, the first or second aspect,
wherein the plurality of branch wires are electrically connected to the plurality of control lines.

[Fourth Aspect] The display device according to, for example, the third aspect, further comprising:
a silicon film; a first metal layer above the silicon film, a second metal layer above the first metal layer; an oxide semiconductor film above the second metal layer; a third metal layer above the oxide semiconductor film; and a fourth metal layer above the third metal layer.

[Fifth Aspect] The display device according to, for example, the second aspect,
wherein the output wire includes: a first portion intersecting with the clock wire; a second portion connected to the first portion through a contact hole; and a third portion positioned in the clearance region.

[Sixth Aspect] The display device according to, for example, the fifth aspect,
wherein the first portion is included in the first metal layer, and the clock wire is included in the fourth metal layer.

[Seventh Aspect] The display device according to, for example, the fifth or sixth aspect,
wherein the second portion is included in the second metal layer, the third portion is included in the fourth metal layer, and the plurality of branch wires are included in the second metal layer.

[Eighth Aspect] The display device according to, for example, any one of the fourth to seventh aspects,
wherein the clearance region includes a signal main line intersecting with the plurality of branch wires, and
the signal main line is included in the fourth metal layer.

[Ninth Aspect] The display device according to, for example, any one of the fourth to eighth aspects,
wherein each of the plurality of branch wires is electrically connected through a relay wire to a corresponding one or more of the plurality of control lines, and
the relay wire is included in the fourth metal layer.

[Tenth Aspect] The display device according to, for example, the ninth aspect,
wherein the plurality of control lines include: control lines included in the first metal layer; and control lines included in the third metal layer.

[Eleventh Aspect] The display device according to, for example, the tenth aspect,
wherein the control lines included in the first metal layer are a plurality of light-emission control lines,
the control lines included in the third metal layer are a plurality of reset lines, and
the plurality of signal lines are a plurality of scan signal lines.

[Twelfth Aspect] The display device according to, for example, the eleventh aspect,
wherein each of the plurality of branch wires is electrically connected to one of the plurality of light-emitting control lines and one of the plurality of reset lines.

[Thirteenth Aspect] The display device according to, for example, the twelfth aspect,
each of the plurality of pixel circuits includes: a light-emission control transistor having a control terminal connected to the one light-emission control line; and a reset transistor having a control terminal connected to the one reset line.

[Fourteenth Aspect] The display device according to, for example, the thirteenth aspect,
wherein the light-emission control transistor turns OFF during a non light-emission period, and
during the non-light emission period, the reset transistor turns ON, and a potential of one of electrodes of the light-emitting element is reset.

The invention claimed is:
1. A display device, comprising:
a display region including a plurality of pixel circuits each including a light-emitting element;
a plurality of signal lines and a plurality of control lines connected to the plurality of pixel circuits;
a first driver configured to drive the plurality of control lines;
a second driver disposed between the display region and the first driver, and configured to drive the plurality of signal lines;
an output wire extending from the first driver, intersecting with the second driver, and reaching a clearance region between the second driver and the display region;
a plurality of branch wires connected to the output wire in the clearance region;
a silicon film;
a first metal layer above the silicon film;

a second metal layer above the first metal layer;
an oxide semiconductor film above the second metal layer;
a third metal layer above the oxide semiconductor film; and
a fourth metal layer above the third metal layer, wherein
the second driver includes a clock wire through which a clock signal is transmitted,
the output wire further intersects with the clock wire,
the output wire further includes:
  a first portion intersecting with the clock wire,
  a second portion connected to the first portion through a contact hole, and
  a third portion positioned in the clearance region,
the first portion is included in the first metal layer, and
the clock wire is included in the fourth metal layer.

2. The display device according to claim 1,
wherein the plurality of branch wires is electrically connected to the plurality of control lines.

3. The display device according to claim 1,
wherein the second portion is included in the second metal layer, the third portion is included in the fourth metal layer, and the plurality of branch wires is included in the second metal layer.

4. The display device according to claim 1,
wherein the clearance region includes a signal main line intersecting with the plurality of branch wires, and
the signal main line is included in the fourth metal layer.

5. The display device according to claim 1,
wherein each of the plurality of branch wires is electrically connected through a relay wire to a corresponding one or more of the plurality of control lines, and
the relay wire is included in the fourth metal layer.

6. The display device according to claim 1,
wherein the plurality of control lines includes:
control lines included in the first metal layer; and
control lines included in the third metal layer.

7. The display device according to claim 6,
wherein the control lines included in the first metal layer are a plurality of light-emission control lines,
the control lines included in the third metal layer are a plurality of reset lines, and
the plurality of signal lines is a plurality of scan signal lines.

8. The display device according to claim 7,
wherein each of the plurality of branch wires is electrically connected to one of the plurality of light-emission control lines and one of the plurality of reset lines.

9. The display device according to claim 8,
wherein each of the plurality of pixel circuits includes:
a light-emission control transistor having a control terminal connected to the one light-emission control line; and
a reset transistor having a control terminal connected to the one reset line.

10. The display device according to claim 9,
wherein the light-emission control transistor turns OFF during a non-light emission period, and
during the non-light emission period, the reset transistor turns ON, and a potential of one of electrodes of the light-emitting element is reset.

11. A display device, comprising:
a display region including a plurality of pixel circuits each including a light-emitting element;
a plurality of signal lines and a plurality of control lines connected to the plurality of pixel circuits;
a first driver configured to drive the plurality of control lines;
a second driver disposed between the display region and the first driver, and configured to drive the plurality of signal lines;
an output wire extending from the first driver, intersecting with the second driver, and reaching a clearance region between the second driver and the display region;
a plurality of branch wires connected to the output wire in the clearance region;
a silicon film;
a first metal layer above the silicon film;
a second metal layer above the first metal layer;
an oxide semiconductor film above the second metal layer;
a third metal layer above the oxide semiconductor film; and
a fourth metal layer above the third metal layer, wherein
the second driver includes a clock wire through which a clock signal is transmitted,
the output wire further intersects with the clock wire,
the output wire further includes:
  a first portion intersecting with the clock wire;
  a second portion connected to the first portion through a contact hole; and
  a third portion positioned in the clearance region,
the second portion is included in the second metal layer,
the third portion is included in the fourth metal layer, and
the plurality of branch wires is included in the second metal layer.

12. The display device according to claim 11,
wherein the clearance region includes a signal main line intersecting with the plurality of branch wires, and
the signal main line is included in the fourth metal layer.

13. A display device, comprising:
a display region including a plurality of pixel circuits each including a light-emitting element;
a plurality of signal lines and a plurality of control lines connected to the plurality of pixel circuits;
a first driver configured to drive the plurality of control lines;
a second driver disposed between the display region and the first driver, and configured to drive the plurality of signal lines;
an output wire extending from the first driver, intersecting with the second driver, and reaching a clearance region between the second driver and the display region;
a plurality of branch wires connected to the output wire in the clearance region;
a silicon film;
a first metal layer above the silicon film;
a second metal layer above the first metal layer;
an oxide semiconductor film above the second metal layer;
a third metal layer above the oxide semiconductor film; and
a fourth metal layer above the third metal layer, wherein
the second driver includes a clock wire through which a clock signal is transmitted,
the output wire further intersects with the clock wire,
the clearance region includes a signal main line intersecting with the plurality of branch wires, and
the signal main line is included in the fourth metal layer.

14. The display device according to claim 13,
wherein each of the plurality of branch wires is electrically connected through a relay wire to a corresponding one or more of the plurality of control lines, and
the relay wire is included in the fourth metal layer.

* * * * *